(12) United States Patent
Ogawa et al.

(10) Patent No.: US 10,531,036 B2
(45) Date of Patent: Jan. 7, 2020

(54) COMPARATOR CIRCUIT, SOLID-STATE IMAGING APPARATUS, AND ELECTRONIC DEVICE

(71) Applicant: SONY CORPORATION, Tokyo (JP)

(72) Inventors: Koji Ogawa, Kanagawa (JP); Yusuke Oike, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/164,069

(22) Filed: Oct. 18, 2018

(65) Prior Publication Data

US 2019/0052826 A1 Feb. 14, 2019

Related U.S. Application Data

(63) Continuation of application No. 15/981,390, filed on May 16, 2018, now Pat. No. 10,154,223, which is a (Continued)

(30) Foreign Application Priority Data

Jul. 15, 2014 (JP) ................................. 2014-144772

(51) Int. Cl.
| | |
|---|---|
| *H04N 5/378* | (2011.01) |
| *H01L 27/146* | (2006.01) |
| *H04N 5/374* | (2011.01) |
| *H03K 5/24* | (2006.01) |
| *H03M 1/12* | (2006.01) |
| *H03M 1/56* | (2006.01) |

(52) U.S. Cl.
CPC ....... *H04N 5/378* (2013.01); *H01L 27/14643* (2013.01); *H03K 5/2472* (2013.01); *H03K 5/2481* (2013.01); *H04N 5/374* (2013.01); *H03M 1/123* (2013.01); *H03M 1/1295* (2013.01); *H03M 1/56* (2013.01)

(58) Field of Classification Search
CPC .. H04N 5/378; H04N 5/374; H01L 27/14643; H03K 5/2472; H03K 5/2481; H03M 1/56; H03M 1/1295; H03M 1/123
See application file for complete search history.

(56) References Cited

U.S. PATENT DOCUMENTS

| | | | | |
|---|---|---|---|---|
| 8,179,465 B2* | 5/2012 | Tanaka | ............. | H04N 5/365 |
| | | | | 348/308 |
| 8,355,068 B2* | 1/2013 | Kondo | ............. | H04N 5/378 |
| | | | | 348/308 |

(Continued)

*Primary Examiner* — Padma Haliyur
(74) *Attorney, Agent, or Firm* — Sheridan Ross P.C.

(57) ABSTRACT

The present technology relates to a comparator circuit, a solid-state imaging apparatus, and an electronic device which enable to improve a frame rate. A comparator compares an analog signal with a reference signal, an amplification stage amplifies output of a comparing unit and has different output change speeds in normal rotation and in reverse rotation, and a switch circuit fixes an input node or an output node of the amplification stage to a predetermined voltage in a predetermined period before a comparing operation by the comparator so that the amplification stage operates in a change direction having a higher output change speed. The present technology can be applied to a comparator circuit provided to an A/D converter of a CMOS image sensor.

34 Claims, 13 Drawing Sheets

Related U.S. Application Data continuation of application No. 15/324,378, filed as application No. PCT/JP2015/068966 on Jul. 1, 2015, now Pat. No. 10,009,566.

(56) References Cited

U.S. PATENT DOCUMENTS

| | | | |
|---|---|---|---|
| 8,885,084 B2* | 11/2014 | Egawa | H04N 5/355 348/300 |
| 2013/0201361 A1* | 8/2013 | Yang | H04N 5/23229 348/222.1 |
| 2014/0232890 A1* | 8/2014 | Yoo | H04N 5/23245 348/220.1 |

* cited by examiner

COMPARATOR CIRCUIT, SOLID-STATE IMAGING APPARATUS, AND ELECTRONIC DEVICE

CROSS REFERENCE TO RELATED APPLICATIONS

This application is a continuation of U.S. patent application Ser. No. 15/981,390, filed May 16, 2018, which is a continuation of U.S. patent application Ser. No. 15/324,378, filed Jan. 6, 2017, now U.S. Pat. No. 10,009,566, which is a national stage application under 35 U.S.C. 371 and claims the benefit of PCT Application No. PCT/JP2015/068966 having an international filing date of Jul. 1, 2015, which designated the U.S., which PCT application claimed the benefit of Japanese Patent Application No. 2014-144772 filed Jul. 15, 2014, the disclosures of which are incorporated herein by reference in their entirety.

TECHNICAL FIELD

The present technology relates to a comparator circuit, a solid-state imaging apparatus, and an electronic device, and, more specifically, relates to a comparator circuit, a solid-state imaging apparatus, and an electronic device which enable to improve a frame rate.

BACKGROUND ART

In a common image sensor, charge stored in a light receiving part (for example, photodiode) of a unit pixel is read as a pixel signal and analog-to-digital (A/D) converted. There is known a solid-state imaging apparatus which achieves the conversion accuracy of the A/D conversion by switching the gradient of a reference voltage (for example, see Patent Document 1).

In the configuration of Patent Document 1, by connecting two A/D conversion circuits to the same pixel array and inputting reference voltages Vref1 and Vref2 each having a different gradient to the A/D conversion circuits from two reference voltage generation units, A/D conversion is performed with two types of gradation accuracy.

However, with the configuration of Patent Document 1, because of providing the two A/D conversion circuits, the circuit area and the power consumption are twice those of a conventional configuration. Thus, there has been proposed a configuration in which one A/D conversion circuit is provided, a determination unit determines the magnitude of a pixel signal, and either of two reference voltages Vref1 and Vref2 each having a different gradient is selected based on the determination result.

However, since the comparison accuracy (offset error) in the determination unit is different from the comparison accuracy (offset error) in a comparator of the A/D conversion circuit, although, for example, the determination unit determines that the incident light is low illuminance and that the amplitude of the pixel signal is small, the comparator of the A/D conversion circuit determines that the reference voltage is outside the voltage range due to the offset error, and the output image can be damaged. Thus, the reference voltage needs to be supplied in a voltage range with a margin for the error.

In contrast, there has been proposed a configuration in which a comparator of an A/D conversion circuit is also used for comparison in a determination unit, and gradation accuracy is selected based on the comparison result (for example, see Patent Document 2).

With the configuration of Patent Document 2, it is possible to reduce the margin in the voltage range of the reference voltage due to the comparison accuracy (offset error) in the determination unit, implement acceleration of A/D conversion or power consumption reduction, and suppress generation of errors in the A/D conversion.

CITATION LIST

Patent Document

Patent Document 1: Japanese Patent Application Laid-Open No. 2011-41091
Patent Document 2: Japanese Patent Application Laid-Open No. 2013-251677

SUMMARY OF THE INVENTION

Problems to be Solved by the Invention

However, in the configuration of Patent Document 2, an output change direction of the comparison result can be different between the comparison in a determination unit and the comparison in an A/D conversion circuit. When the output change direction is optimized in either of normal rotation or reverse rotation in a comparator, delay is caused in the other output change direction, and the frame rate can be deteriorated as a result.

The present technology has been made in consideration of the above situation and enables to improve a frame rate.

Solutions to Problems

A comparator circuit in an aspect of the present technology includes a comparator configured to compare an analog signal with a reference signal, an amplification stage configured to amplify output of the comparing unit and have different output change speeds in normal rotation and in reverse rotation, and a switch circuit configured to fix an input node or an output node of the amplification stage to a predetermined voltage in a predetermined period before a comparing operation by the comparator such that the amplification stage operates in a change direction having a higher output change speed.

The switch circuit can fix, in the predetermined period necessary for the analog signal or the reference signal to be stabilized, the input node of the amplification stage to the predetermined voltage at which the amplification stage operates in the change direction having the higher output change speed based on a threshold voltage of the amplification stage.

The switch circuit can release the input node of the amplification stage from the predetermined voltage after the analog signal or the reference signal is stabilized.

The switch circuit can fix, in the predetermined period necessary for input of the amplification stage to be stabilized, the output node of the amplification stage to the predetermined voltage at which the amplification stage operates in the change direction having the higher output change speed.

The switch circuit can release the output node of the amplification stage from the predetermined voltage after the input of the amplification stage is stabilized.

The analog signal can be a pixel signal output from a unit pixel.

A solid-state imaging apparatus in an aspect of the present technology includes a pixel array unit having a plurality of pixels, a comparator circuit including a comparator configured to compare an analog signal output from the pixel with a reference signal, an amplification stage configured to amplify output of the comparing unit and have different output change speeds in normal rotation and in reverse rotation, and a switch circuit configured to fix an input node or an output node of the amplification stage to a predetermined voltage in a predetermined period before a comparing operation by the comparator such that the amplification stage operates in a change direction having a higher output change speed, a selecting unit configured to select, according to a comparison result of the analog signal with one or more of the reference signals by the comparator circuit, any one of the one or more of the reference signals having gradation accuracy different from each other, a switching unit configured to switch, according to a selection result by the selecting unit, the reference signal to be supplied to the comparator circuit, and a measuring unit configured to measure change timing of the comparison result, by the comparator circuit, of the analog signal with the reference signal supplied to the comparator circuit by switching control of the switching unit.

An electronic device in an aspect of the present technology includes a solid-state imaging apparatus including a pixel array unit having a plurality of pixels, a comparator circuit including a comparator configured to compare an analog signal output from the pixel with a reference signal, an amplification stage configured to amplify output of the comparing unit and have different output change speeds in normal rotation and in reverse rotation, and a switch circuit configured to fix an input node or an output node of the amplification stage to a predetermined voltage in a predetermined period before a comparing operation by the comparator such that the amplification stage operates in a change direction having a higher output change speed, a selecting unit configured to select, according to a comparison result of the analog signal with one or more of the reference signals by the comparator circuit, any one of the one or more of the reference signals having gradation accuracy different from each other, a switching unit configured to switch, according to a selection result by the selecting unit, the reference signal to be supplied to the comparator circuit, and a measuring unit configured to measure change timing of the comparison result, by the comparator circuit, of the analog signal with the reference signal supplied to the comparator circuit by switching control of the switching unit.

In an aspect of the present technology, an input node or an output node of an amplification stage is fixed to a predetermined voltage in a predetermined period before a comparing operation by a comparator such that the amplification stage operates in a change direction having a higher output change speed.

Effects of the Invention

According to an aspect of the present technology, it is possible to improve a frame rate.

MODE FOR CARRYING OUT THE INVENTION

Hereinafter, with reference to the drawings, an embodiment of the present technology is described.

<Configuration Example of CMOS Image Sensor>

Figure 1:
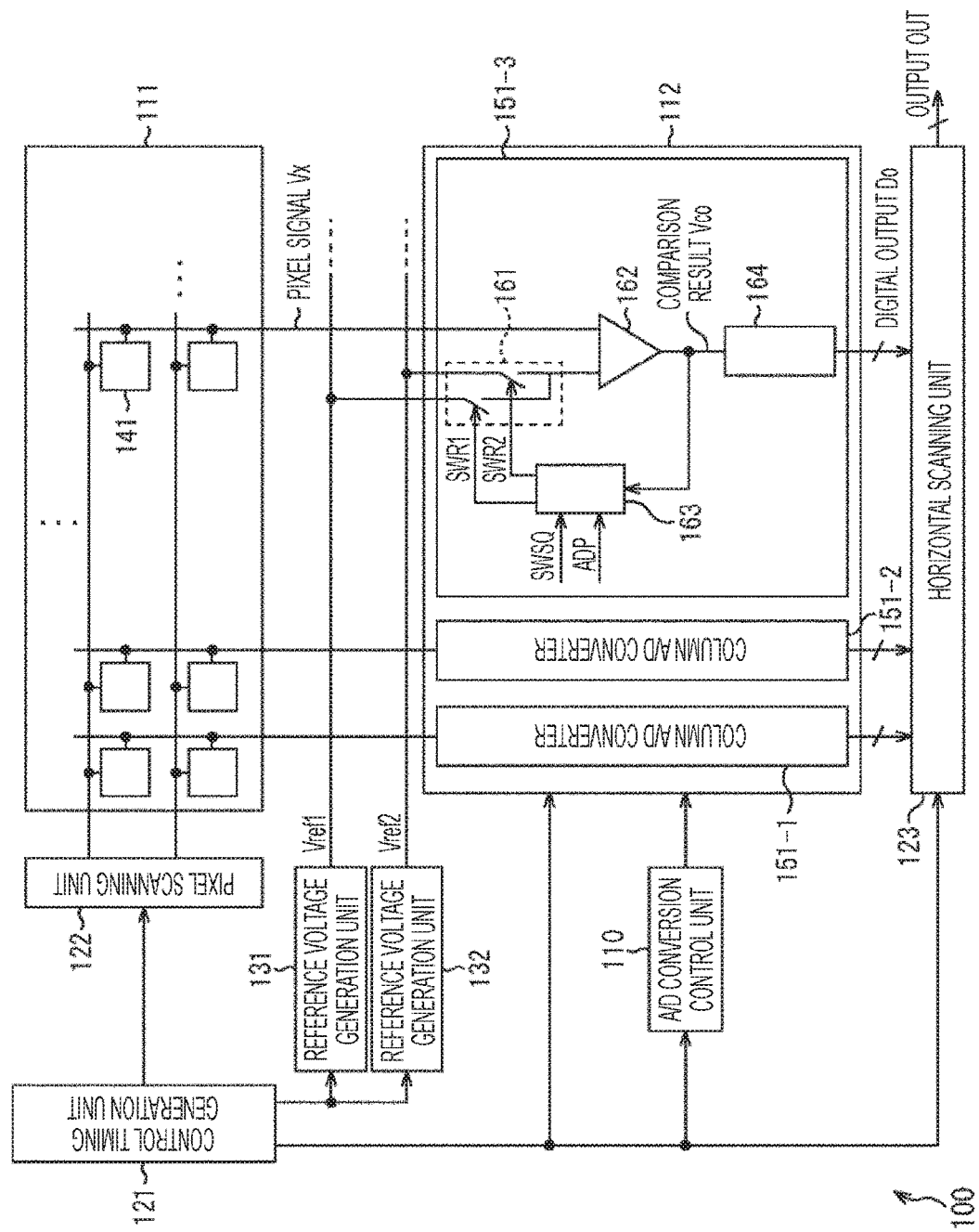
FIG. 1 is a block diagram illustrating a configuration example of a CMOS image sensor.

FIG. 1 is a diagram illustrating a main configuration example of a complementary metal oxide semiconductor (CMOS) image sensor. A CMOS image sensor 100 illustrated in FIG. 1 is an example of a solid-state imaging apparatus to which the present technology is applied, and the present technology may be applied to image sensors having other configurations.

As illustrated in FIG. 1, the CMOS image sensor 100 includes a pixel array 111 and an A/D converter 112. The CMOS image sensor 100 performs photoelectric conversion to incident light on the pixel array 111, A/D converts an obtained analog signal with the A/D converter 112, and outputs the digital data corresponding to the incident light.

The pixel array 111 is formed by arranging unit pixels 141 each having a photoelectric conversion element in matrix. Note that, only a part of unit pixels is illustrated FIG. 1, and the number of pixels is arbitrary. Naturally, the numbers of rows and columns are arbitrary.

The A/D converter 112 includes a column A/D converter 151 provided to each column of the pixel array 111. The column A/D converter 151 A/D converts as analog pixel signal Vx read from each unit pixel of the corresponding column.

FIG. 1 illustrates only a column A/D converter 151-1 corresponding to the first column from the left of the pixel array 111, a column A/D converter 151-2 corresponding to the second column from the left, and a column A/D converter 151-3 corresponding to the third column from the left. Actually, the A/D converter 112 includes the column A/D converters 151 corresponding to all pixel arrays of the pixel array 111. When it is not necessary to explain the column A/D converters in distinction from each other, it is simply referred to as a column A/D converter 151.

Note that, the number of the column A/D converters 151 may not be matched with the number of columns of the pixel array 111. For example, one column A/D converter 151 may A/D convert the pixel signals Vx of a plurality of columns of the pixel array 111. For example, the column A/D converter 151 may perform A/D conversion processing to the pixel signal Vx of each corresponding column in a time-division manner.

Furthermore, the CMOS image sensor 100 includes an A/D conversion control unit 110, a control timing generation unit 121, a pixel scanning unit 122, a horizontal scanning unit 123, a reference voltage generation unit 131, and a reference voltage generation unit 132.

The control timing generation unit 121 controls operation timing of the processing units by, for example, supplying a clock signal to the A/D conversion control unit 110, the A/D converter 112, the pixel scanning unit 122, the horizontal scanning unit 123, the reference voltage generation unit 131, and the reference voltage generation unit 132.

The pixel scanning unit 122 supplies a control signal to each unit pixel 141 of the pixel array 111 to control the operation. The horizontal scanning unit 123 sequentially outputs the digital data supplied from each column A/D converter 151 for each row of the unit pixel.

The A/D conversion control unit 110 controls the operation of each column A/D converter 151. The reference voltage generation unit 131 supplies a reference voltage Vref1 to each column A/D converter 151. The reference voltage generation unit 132 supplies a reference voltage Vref2 which is different from the reference voltage Vref1 to each column A/D converter 151.

Here, each column A/D converter 151 of the A/D converter 112 operates at the timing controlled by the control timing generation unit 121.

The column A/D converter 151 includes a switching unit 161, a comparing unit 162, a selecting unit 163, and a timing measuring unit 164. Note that, although FIG. 1 illustrates the configuration of the column A/D converter 151-3, all of the column A/D converters 151 including the column A/D converter 151-1 and the column A/D converter 151-2 each have a configuration similar to that of the column A/D converter 151-3.

The switching unit 161 is provided between the reference voltage generation unit 131 and the comparing unit 162, and has a switch which controls the connection and disconnection (ON and OFF) of them based on a control signal SWR1 supplied from the selecting unit 163. Furthermore, the switching unit 161 is provided between the reference voltage generation unit 132 and the comparing unit 162, and has a switch which controls the connection and disconnection (ON and OFF) of them based on a control signal SWR2 supplied from the selecting unit 163. In other words, the switching unit 161 supplies, to the comparing unit 162, either of the reference voltage Vref1 supplied from the reference voltage generation unit 131 or the reference voltage Vref2 supplied from the reference voltage generation unit 132 which is selected by the selecting unit 163.

The comparing unit 162 compares the voltage of the analog pixel signal Vx read from the unit pixel 141 with the reference voltage (Vref1 or Vref2) supplied from the switching unit 161. The comparing unit 162 supplies a comparison result Vco to the selecting unit 163 and the timing measuring unit 164.

The comparing unit 162 compares the reference voltage at which a predetermined voltage width is to be scanned with the voltage of the pixel signal Vx to A/D convert the pixel signal Vx. Furthermore, the comparing unit 162 compares a reference voltage having a predetermined magnitude (a predetermined determination value) with the pixel signal Vx to determine the gradation accuracy when the pixel signal Vx is A/D converted.

As described above, the comparison when the pixel signal Vx is A/D converted and the comparison when the gradation accuracy is determined are performed by one comparing unit 162. Thus, the column A/D converter 151 can reduce the margin necessary for the voltage range of the reference voltage and implement acceleration of the A/D conversion or power consumption reduction.

The selecting unit 163 selects the reference voltage to be supplied to the comparing unit 162 under the control of the A/D conversion control unit 110. To the selecting unit 163, a control signal ADP and a control signal SWSQ are supplied from the A/D conversion control unit 110. The selecting unit 163 selects, at the timing based on these values, either of the reference voltage Vref1 or the reference voltage Vref2 on the basis of the comparison result Vco supplied from the comparing unit 162. The selecting unit 163 determines the values of the control signal SWR1 and the control signal SWR2 and supplies the determined values to the switching unit 161 so that the switching unit 161 supplies the selected reference voltage to the comparing unit 162.

The timing measuring unit 164 has a counter and counts, with the counter, the time from when the comparison is started in the comparing unit 162 to the timing when the value of the comparison result Vco is changed. The timing measuring unit 164 supplies the count value (that is, the length of time from when the comparison is started in the comparing unit 162 to the timing when the value of the comparison result Vco is changed) to the horizontal scanning unit 123 as the digital data of the pixel signal Vx.

Note that, the timing measuring unit 164 has a counter capable of performing both of up-counting and down-counting. Thus, the timing measuring unit 164 can implement the subtraction, with the count operation, between the count value of the comparison of a first analog signal which is a variance component of a pixel output with the reference voltage and the count value of the comparison of a second analog signal obtained by adding the variance component to a signal component with the reference voltage. In short, the timing measuring unit 164 can easily perform the subtraction. Furthermore, since the timing measuring unit 164 can perform the subtraction in a digital region, it is possible to suppress the increase in circuit scale and power consumption.

<Operation of CMOS Image Sensor>

Next, the operation of the CMOS image sensor is described.

Figure 2:
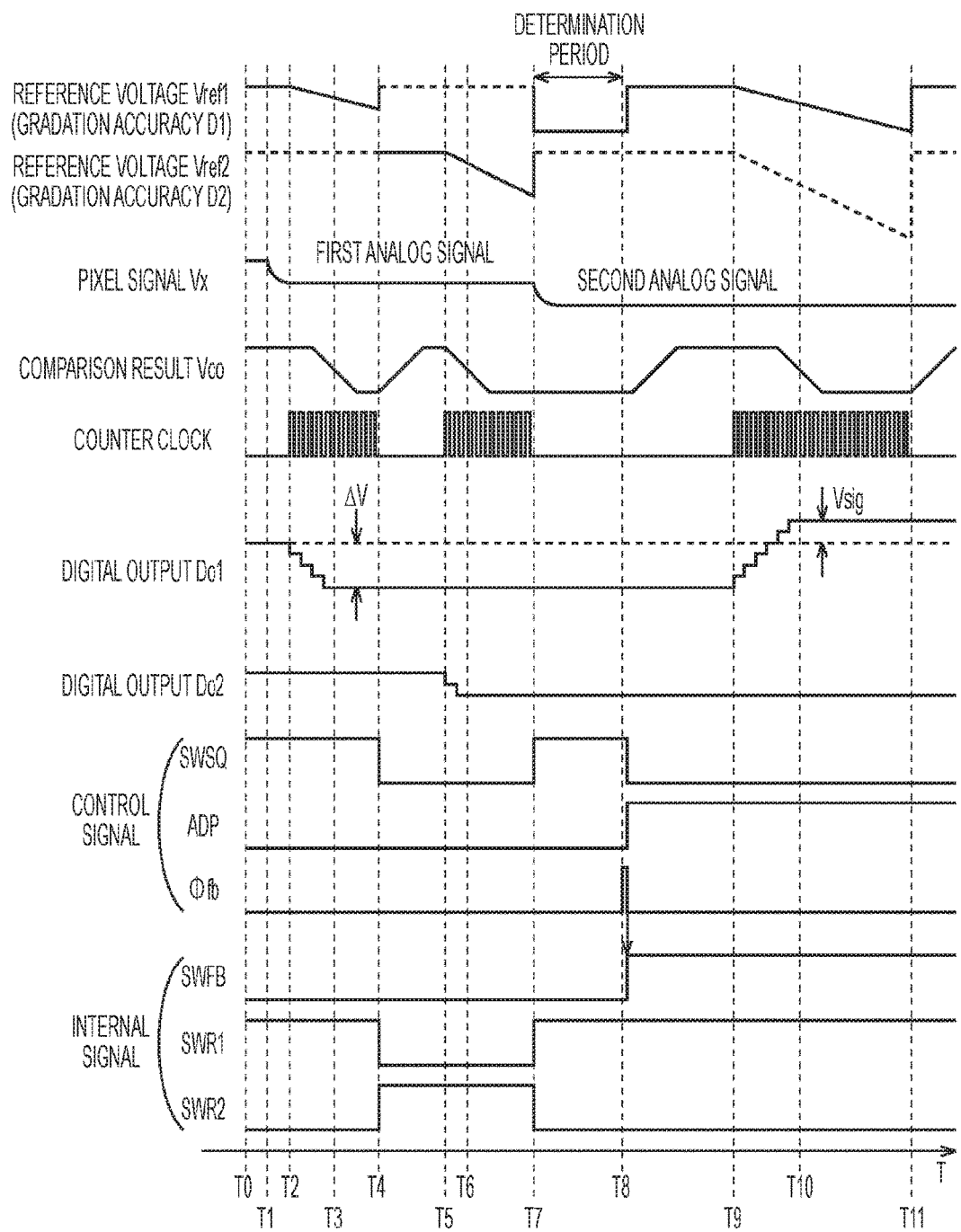
FIG. 2 is a timing chart explaining an operation of the CMOS image sensor.

FIG. 2 is a timing chart illustrating an example of A/D conversion when incident light brightness is low, that is, when the amplitude of the second analog signal is small. Note that, here, each operation timing regarding A/D conversion processing to the pixel signal Vx read from a unit pixel 141 is described.

When the reading of the pixel signal Vx from a unit pixel 141 is started at time T0, the reading of the first analog signal (a variance component ΔV) is started at time T1.

The reference voltage generation unit 131 starts the voltage scanning of the reference voltage Vref1 at time T2. The reference voltage generation unit 131 scans the reference voltage Vref1 by a pitch of a set gradation accuracy D1 (for example, 60 uV/LSB) in the direction from larger voltage to smaller voltage (comparison direction) (that is, performs scanning from dark side to bright side). This scanning is to be continued until time T4.

In the period from time T0 to time T4, the control signal SWSQ is set to H-level, the control signal ADP is set to L-level, and a control signal Φfb is set to L-level. In other words, the selecting unit 163 selects the reference voltage Vref1, and the switching unit 161 supplies the reference voltage Vref1 generated by the reference voltage generation unit 131 to the comparing unit 162.

In the period from time T2 to time T4 in which the reference voltage Vref1 is scanned, the comparing unit 162 compares the pixel signal Vx (the first analog signal) with the reference voltage Vref1. The timing measuring unit 164 starts to count the counter clock from time T2. This count is to be continued until the comparison result Vco of the pixel signal Vx (the first analog signal) with the reference voltage Vref1 is changed, or until time T4.

It is assumed that the comparison result Vco is changed at time T3 before time T4. In this case, the timing measuring unit 164 stops counting at time T3. The timing measuring unit 164 outputs the count value as a digital output Do1. In other words, the digital output Do1 is a digital value of ΔV.

After the comparison of the reference voltage Vref1 with the first analog signal, then, the reference voltage Vref2 is compared with the first analog signal. The control signal SWSQ is switched to L-level at time T4, and the reference voltage Vref2 generated by the reference voltage generation unit 132 is supplied to the comparing unit 162 by the switching unit 161.

After a standby until the value of the comparison result Vco is changed, the reference voltage generation unit 132 starts the voltage scanning of the reference voltage Vref2 at time T5. The reference voltage generation unit 132 scans the reference voltage Vref2 by a pitch of a set gradation accuracy D2 which is different from the gradation accuracy D1 (for example, 240 uV/LSB) in the direction from larger voltage to smaller voltage (comparison direction) (that is, performs scanning from dark side to bright side). This scanning is to be continued until time T7.

During the time, the comparing unit 162 compares the pixel signal Vx (the first analog signal) with the reference voltage Vref2. The timing measuring unit 164 starts to count the counter clock from time T5. This count is to be continued until the comparison result Vco of the pixel signal Vx (the first analog signal) with the reference voltage Vref2 is changed, or until time T7.

It is assumed that the comparison result Vco is changed at time T6 before time T7. In this case, the timing measuring unit 164 stops counting at time T6. The timing measuring unit 164 outputs the count value as a digital output Do2. In other words, the digital output Do2 is a digital value of ΔV.

After the comparison of the reference voltage Vref1 and the reference voltage Vref2 with the first analog signal, then, the reference voltage is compared with the second analog signal. The control signal SWSQ is switched to L-level at time T4, and the reference voltage Vref2 generated by the reference voltage generation unit 132 is supplied to the comparing unit 162 by the switching unit 161.

As described above, the column A/D converter 151 sequentially performs the A/D conversion to the first analog signal by the reference voltage Vref1 and the reference voltage Vref2. By the voltage scanning of the reference voltage, the comparison result Vco is changed at the timing when the pixel signal Vx matches the reference voltage Vref, and it is possible to obtain the voltage value as a digital value by measuring the timing. To measure the timing, for example, a counter circuit can be used. By counting the number of counter clocks and stopping the counting at the timing when the comparison result Vco is changed, the time, that is, the voltage width which the reference voltage has scanned until the comparison result Vco is changed is recorded as a digital value.

The conversion result by the reference voltage Vref1 and the conversion result by the reference voltage Vref2 are stored in the digital outputs Do1 and Do2 respectively. The digital value obtained here is the value of the first analog signal, and this means the digital value is a value obtained by resetting a pixel, that is, a value of the variance component ΔV. Naturally, the digital outputs Do1 and Do2 are A/D converted from the same first analog signal, but have different gradation accuracy, and have a different digital value.

Subsequently, the column A/D converter 151 sets the reference voltage Vref1 to a predetermined determination value which is equal or less than the maximum amplitude of the reference voltage Vref1 with respect to the second analog signal, and compares it with the second analog signal in the period from time T7 to time T8.

This comparison is performed using the comparing unit 162 used in the A/D conversion. The obtained comparison result Vco is latched in a latch circuit included in the selecting unit 163 by a pulse of the control signal Φfb and fetched as a signal SWFB at time T8.

On the basis of the comparison result, the reference voltage to be compared with the second analog signal is selected. In the case of the example of FIG. 2, since the amplitude of the second analog signal is small, the second analog s mail is compared with the reference voltage Vref1. In the case of the example of FIG. 2, by the fetch at time T8, the signal SWFB which has been L-level is changed to H-level.

When the comparison result Vco is fetched, the control signal ADP is changed to H-level, and the reference voltage to be supplied to the comparing unit 162 is selected on the basis of the signal SWFB. In the case of the example of FIG. 2, since the signal SWFB becomes H-level, the control signal SWR1 becomes H-level, and the control signal SWR2 becomes L-level. As described above, the reference voltage Vref1 is selected.

After a standby until the value of the comparison result Vco is changed, the reference voltage generation unit 131 starts the voltage scanning of the reference voltage Vref1 at time T9. The reference voltage generation unit 131 scans the reference voltage Vref1 by a pitch of the gradation accuracy D1 in the direction from larger voltage to smaller voltage (comparison direction) (that is, performs scanning from dark side to bright side). This scanning is to be continued until time T11.

During the time, the comparing unit 162 compares the pixel signal Vx (the second analog signal) with the reference voltage Vref1. The timing measuring unit 164 starts to count the counter clock from time T9. This count is to be continued until the comparison result Vco of the pixel signal Vx (the second analog signal) with the reference voltage Vref1 changed, or until time T11.

It is assumed that the comparison result Vco is changed at time T0 before time T11. In this case, the timing measuring unit 164 stops counting at time T10. The timing measuring unit 164 outputs the count value as a digital output Do1.

Since the second analog signal contains the variance component ΔV and a signal component Vsig, the column A/D converter 151 can obtain the digital value equivalent to the signal component Vsig by A/D converting the second analog signal and subtracting the calculated digital value of the first analog signal from the digital value.

Note that, in the period from time T9 to time T11, the reference voltage generation unit 132 also scans the reference voltage Vref2 by a pitch of the gradation accuracy D2 in the direction from larger voltage to smaller voltage (comparison direction) (that is, performs scanning from dark side to bright side). However, in the case of FIG. 2, since the amplitude of the second analog signal is small, the reference voltage Vref2 is not supplied to the comparing unit 162 under the control of the switching unit 161 (is not compared with the second analog signal).

Figure 3:
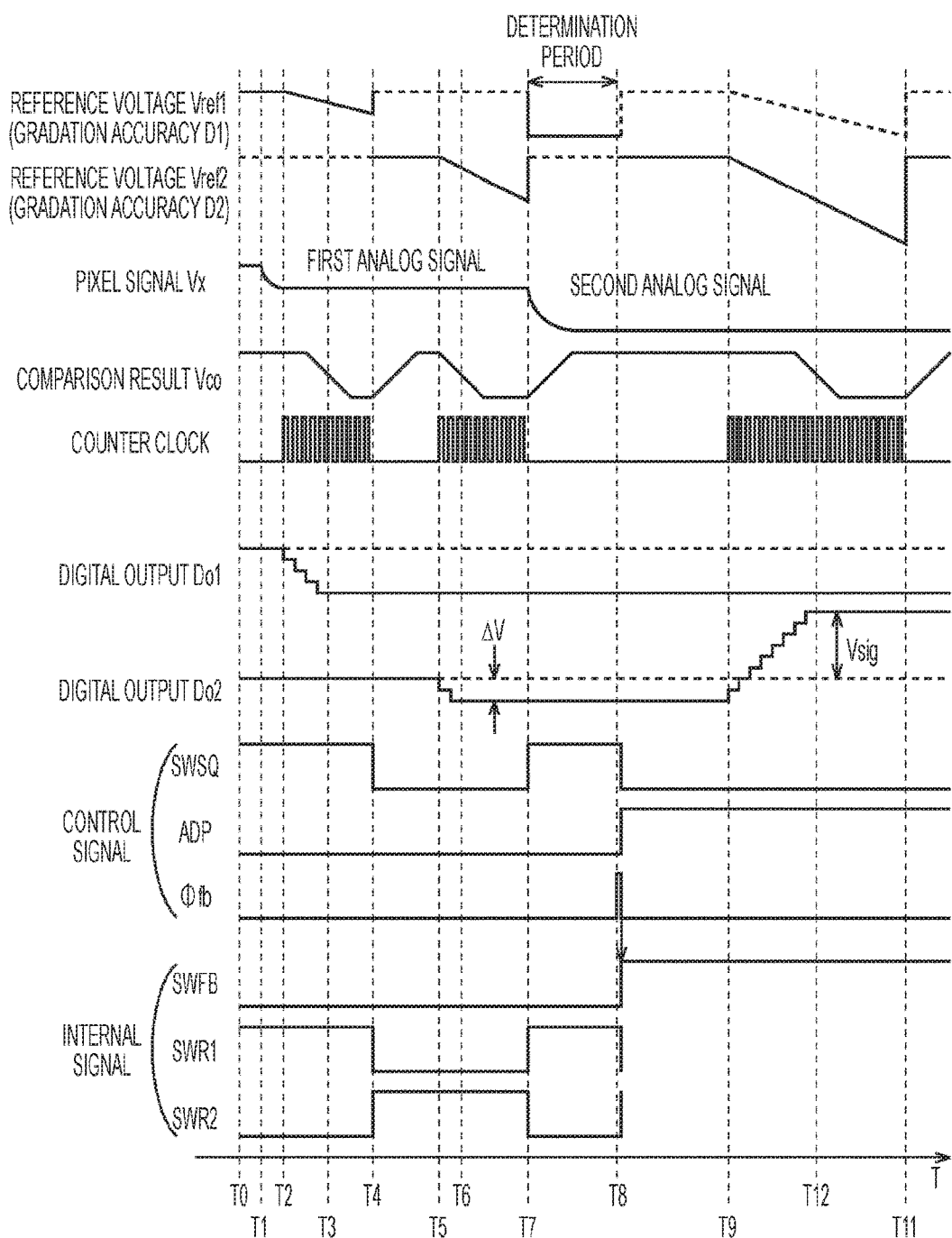
FIG. 3 is a timing chart explaining an operation of the CMOS image sensor.

Next, with reference to the timing chart of FIG. 3, the A/D conversion when the incident light brightness is high, that is, when the amplitude of the second analog signal is large is described.

In the case of FIG. 3, the comparison of the first analog signal with the reference voltage is performed similarly to the case of FIG. 2. In other words, the reference voltages (Vref1 and Vref2) are sequentially compared with the first analog signal.

Furthermore, the comparison of the reference voltage Vref1 set to the predetermined determination value which is equal or less than the maximum amplitude with respect to the second analog signal with the second analog signal is performed similarly to the case of FIG. 2. In short, the processing from time T0 to time T8 is performed similarly to the case of FIG. 2.

However, in the case of the example of FIG. 3, since the amplitude of the second analog signal is large, the second analog signal is compared with the reference voltage Vref2. In the case of the example of FIG. 3, the signal SWFB remains to be L-level after time T8.

<Configuration Example of Conventional Comparator Circuit>

Figure 4:
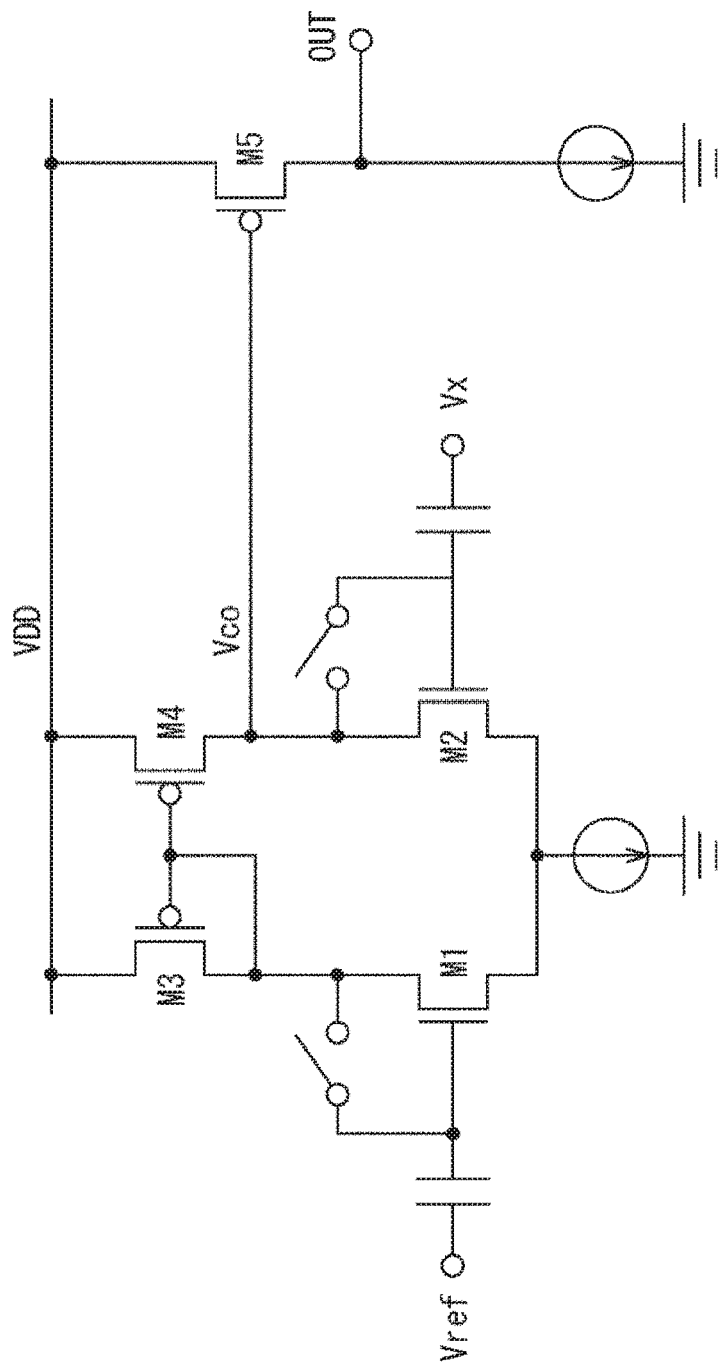
FIG. 4 is a circuit diagram illustrating a configuration example of a conventional comparator circuit.

Here, with reference to the circuit diagram of FIG. 4, a configuration example of a common comparator circuit corresponding to the comparing unit 162 is described.

In the comparator circuit illustrated in FIG. 4, an amplification stage consisting of a source grounded circuit including a MOS transistor M5 and a constant current source is connected to a comparator consisting of a differential input circuit (Nch) including four MOS transistors M1 to M4 by a node Vco to obtain gain.

The reference voltage Vref or the predetermined determination value is input to +input (the MOS transistor M1 side) of the comparator, and the pixel signal Vx is input to −input (the MOS transistor M2 side). When the magnitude relation between the pixel signal Vx and the reference voltage Vref is reversed, the comparison result Vco is changed from one to the other, is amplified by the amplification stage, and output as output OUT.

In the comparing unit 162, the comparison of the pixel signal Vx with the reference voltage Vref or the predetermined determination value is performed based on the change result of the output OUT.

<Details of Operation in Determination Period>

Figure 5:
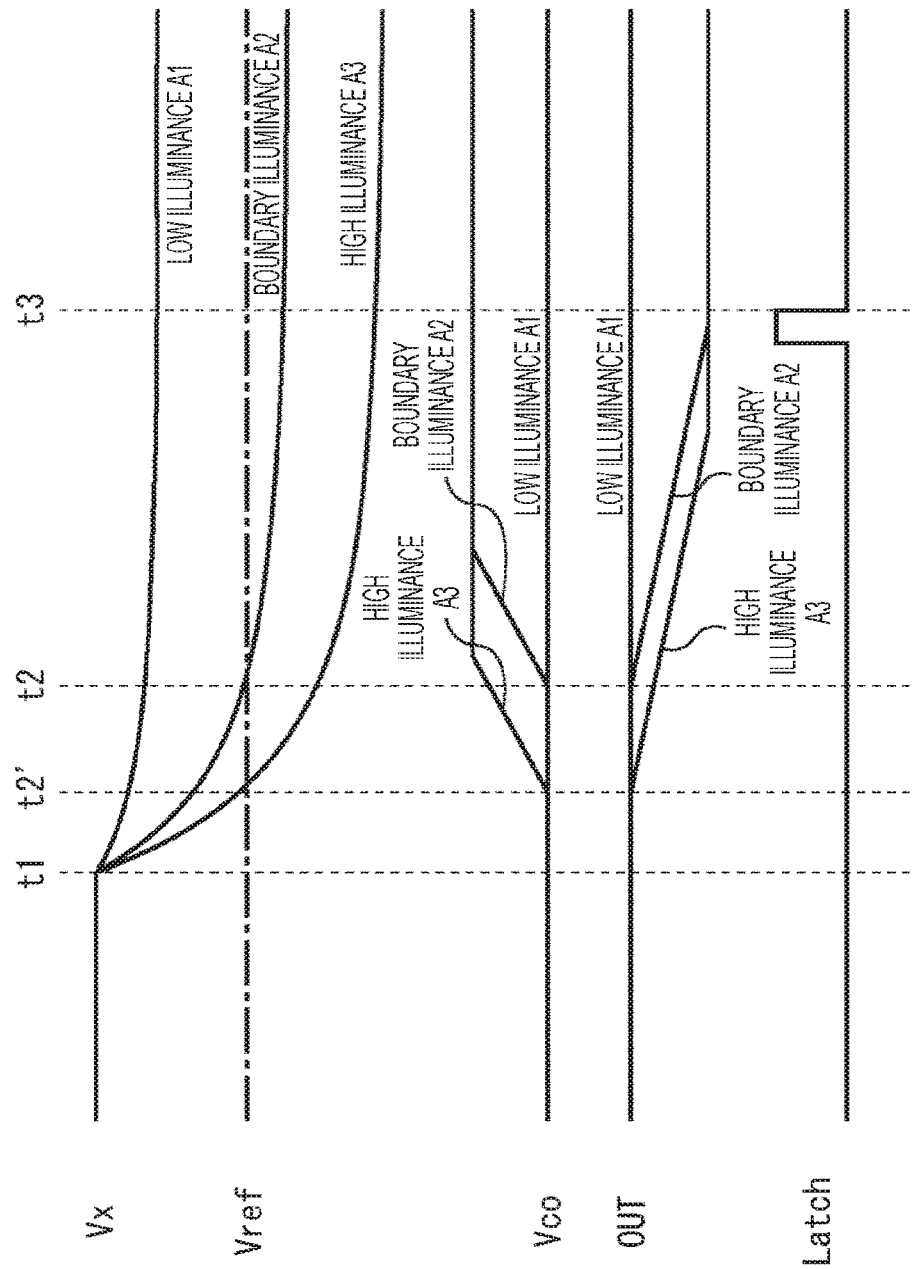
FIG. 5 is a timing chart explaining an operation of the conventional comparator circuit.

Next, with reference to the timing chart of FIG. 5, details of a comparison (determination) operation of the reference voltage (the predetermined determination value) with the pixel signal Vx (the second analog signal) from time T7 to T8 (a determination period) in the timing chart of FIG. 3 when the comparator circuit of FIG. 4 is used are described.

In the timing chart of FIG. 5, time t1, time t2, and time t3 indicate the timing to start to read the pixel signal, the timing when the pixel signal Vx of boundary illuminance A2 intersects the reference voltage Vref, and the timing to stop latching the output OUT as the comparison result respectively. Note that, the period from time t1 to t2 is the time necessary for the pixel signal to be stabilized, and the period from time t2 to t3 is the change delay time of the comparator circuit.

Figure 6:
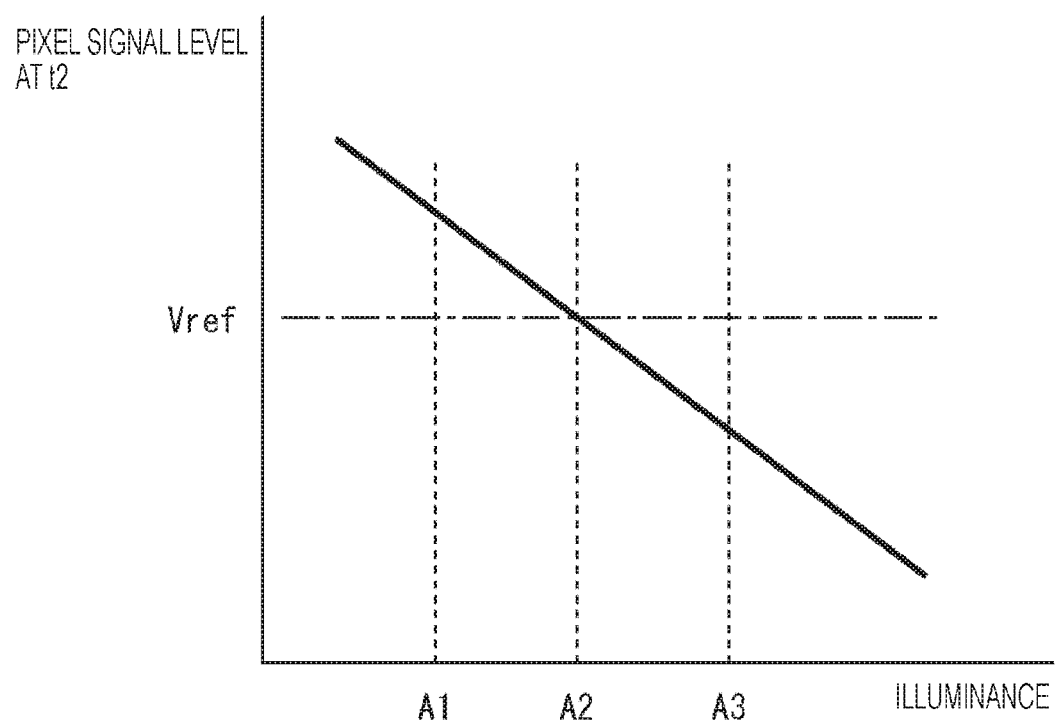
FIG. 6 is a diagram illustrating a relation between illuminance and a pixel signal level.

The boundary illuminance A2 is the illuminance of the pixel signal Vx which is a boundary to determine whether the pixel signal Vx is high illuminance or low illuminance at time t2, and it is assumed that the illuminance lower than the boundary illuminance A2 is low illuminance A1 and the illuminance higher than the boundary illuminance A2 is high illuminance A3 as illustrated in FIG. 6. Note that, the time to reach time t2 is determined by a design of the comparator circuit When the pixel signal Vx is the low illuminance A1, since the amplitude is small and the pixel signal Vx does not intersect the reference voltage Vref, the comparison result Vco is not changed from L, and the output OUT is not changed either.

When the pixel signal Vx is the boundary illuminance A2, as described above, the pixel signal Vx intersects the reference voltage Vref at time t2, the comparison result Vco starts to rise from L, and following the rising, the output OUT starts to fall.

When the pixel signal Vx is the high illuminance A3, the pixel signal Vx intersects the reference voltage Vref at time t2' before time t2, the comparison result Vco starts to rise from L, and following the rising, the output OUT starts to fall.

As described above, since the amplitude of the pixel signal Vx of the high illuminance A3 is larger than that of the pixel signal Vx of the boundary illuminance A2, the comparison result Vco is reversed faster than when the pixel signal Vx is the boundary illuminance A2, and the change of the output OUT is determined.

Here, to obtain a correct determination result in the determination period, it is necessary for time t3 to be set according to the case of the boundary illuminance A2 at which the determination of the change of the output OUT takes the longest time.

Figure 10:
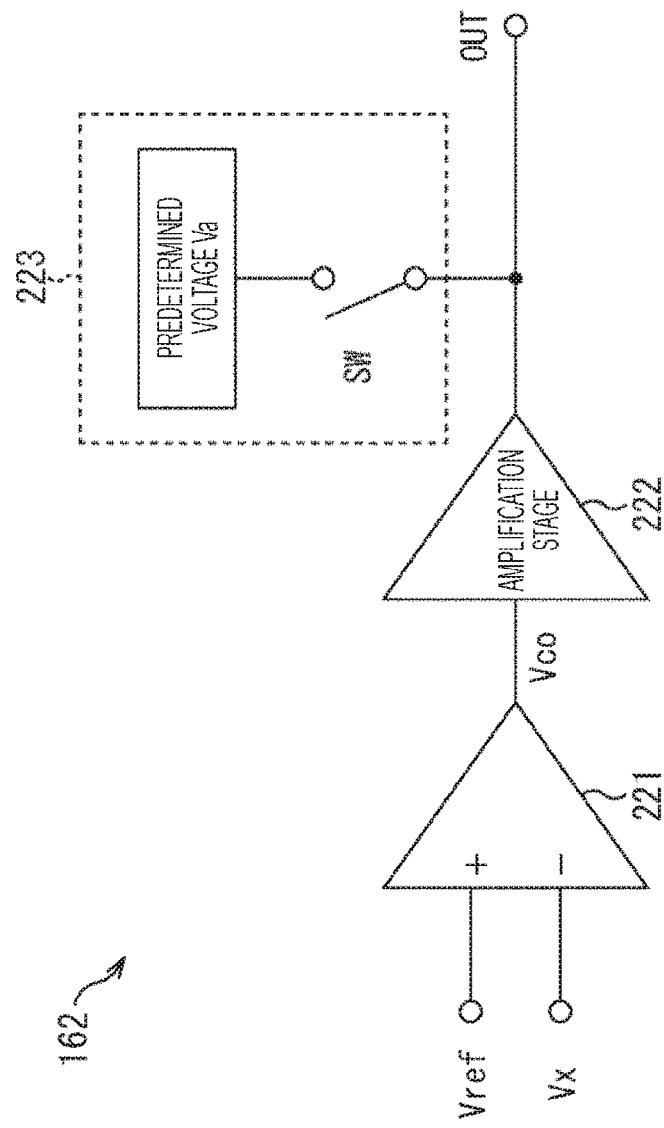
FIG. 10 is a block diagram illustrating a configuration example of the comparator circuit of the present technology.

Incidentally, as illustrated in the timing chart of FIG. 10, the determination period from time T7 to T8 and the period when the A/D conversion is performed from time T9 to T11 are different in the output change direction of the comparison result Vco. In the comparator circuit illustrated in FIG. 4, when the output change direction is optimized in either of normal rotation or reverse rotation, delay is caused in the other output change direction.

Specifically, in the comparator circuit of FIG. 4, the speed of the change from H to L is controlled by the current flowing to the constant current source of the amplification stage. Thus, the change delay time of the comparator circuit from time t2 to t3 in the timing chart of FIG. 5 becomes longer, and this can cause deterioration in the frame rate.

Thus, the configuration of the comparator circuit which shortens the change delay time and improves the frame rate is described below.

<Configuration Example of Comparator Circuit of the Present Technology>

Figure 7:
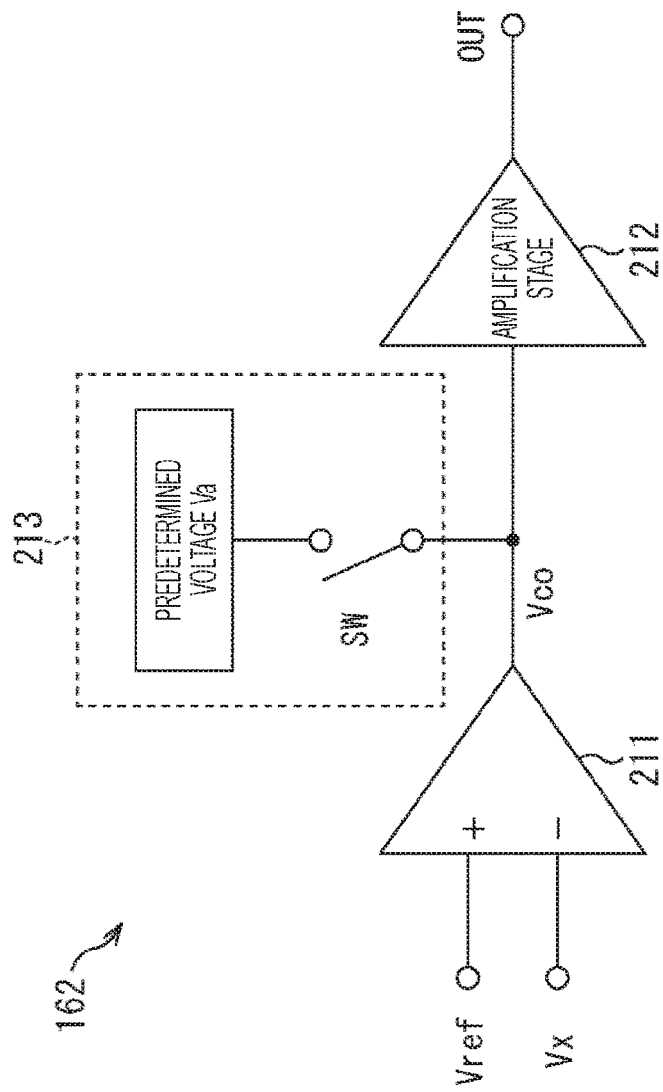
FIG. 7 is a block diagram illustrating a configuration example of a comparator circuit of the present technology.

FIG. 7 is a block diagram illustrating a configuration example of a comparator circuit to which the present technology is applied. The comparator circuit illustrated in FIG. 7 is configured as the comparing unit 162 of the CMOS image sensor of FIG. 1.

As illustrated in FIG. 7, the comparing unit 162 includes a comparator 211, an amplification stage 212, and a switch circuit 213.

The comparator 211 compares the pixel signal Vx input as an analog signal with the reference signal Vref (the predetermined determination value) and outputs the comparison result Vco to the amplification stage 212.

The amplification stage 212 amplifies the comparison result Vco output from the comparator 211 and outputs the result as the output OUT. The amplification stage 212 is designed so that the output change speed is different in normal rotation and in reverse rotation. For example, the amplification stage 212 is designed so that the change speed of the output OUT in the direction from L to H is faster than that in the direction from H to L.

The switch circuit 213 operates to, for example, the input node (Vco) of the amplification stage 212 to a predetermined voltage Va in a predetermined period before the comparing operation by the comparator 211 so that the amplification stage 212 operates in a change direction having a higher output change speed according to the control signal SW supplied from the control timing generation unit 121.

Figure 8:
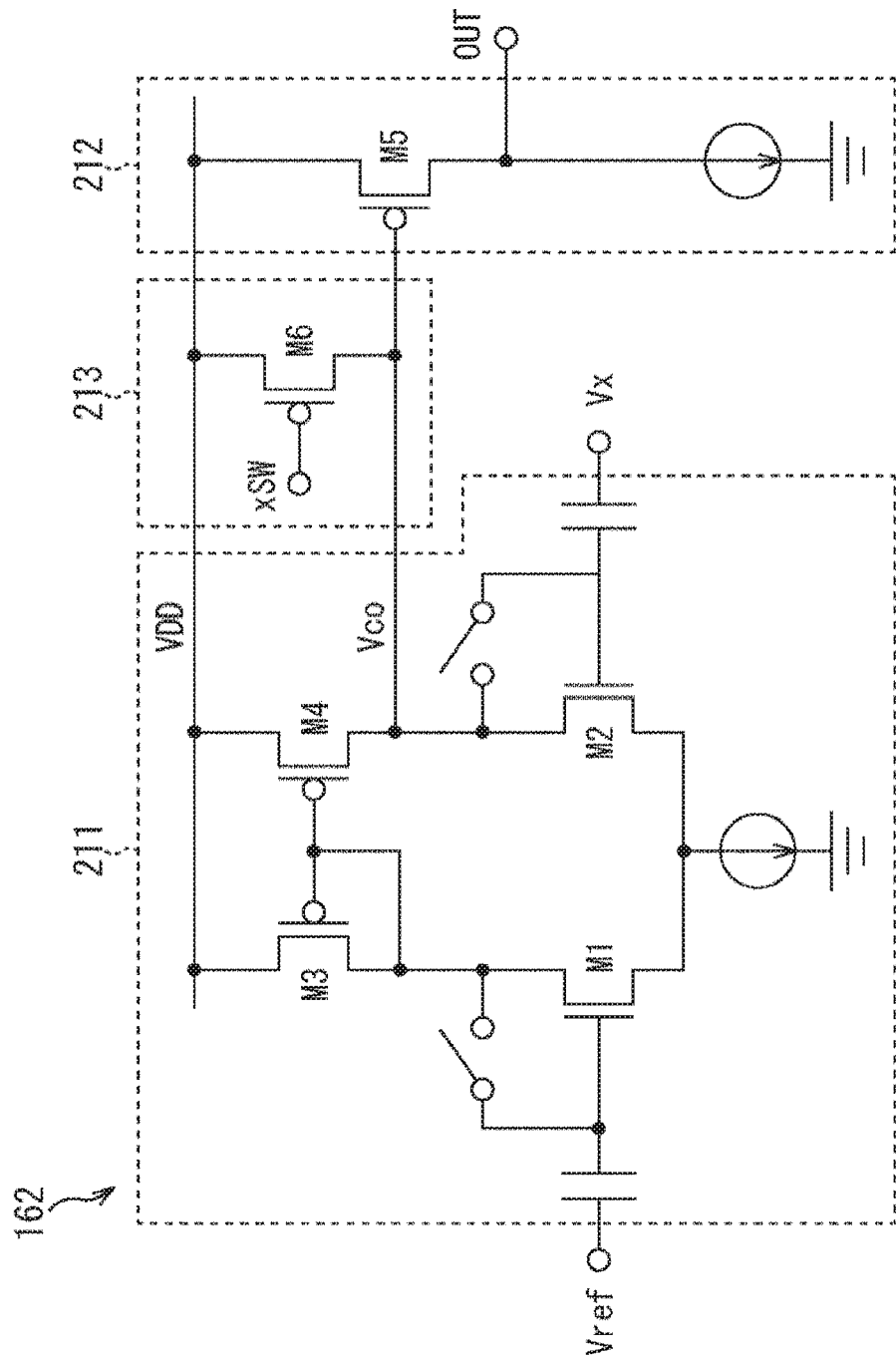
FIG. 8 is a circuit diagram illustrating a configuration example of the comparator circuit of the present technology.

FIG. 8 is a circuit diagram illustrating a configuration example of a comparator circuit 162 of FIG. 7.

In the comparator circuit 162, the comparator 211 consists of a differential input circuit (Nch) including four MOS transistors M1 to M4, and the amplification stage 212 consists of a source grounded circuit (Pch) including a MOS transistor M5 and constant current source.

The reference voltage Vref is input to +input (the MOS transistor M1 side) of the comparator 211, and the pixel signal Vx is input to −input (the MOS transistor M2 side).

The output change direction of the amplification stage 212 is optimized in the direction from the lower voltage with respect to the reference voltage to the intersection between the reference voltage and the pixel signal so that the comparing operation of the reference voltage with the pixel signal in the A/D conversion is accelerated.

Furthermore, in the comparator circuit 162, the switch circuit 213 consists of a P-type MOS transistor M6 which short-circuits the input node of the amplification stage 212 to a supply voltage VDD. To the gate of the transistor M6 constituting the switch circuit 213, a pulse xSW obtained by reversing the control signal SW is input.

<Operation Example of Comparator Circuit>

Figure 9:
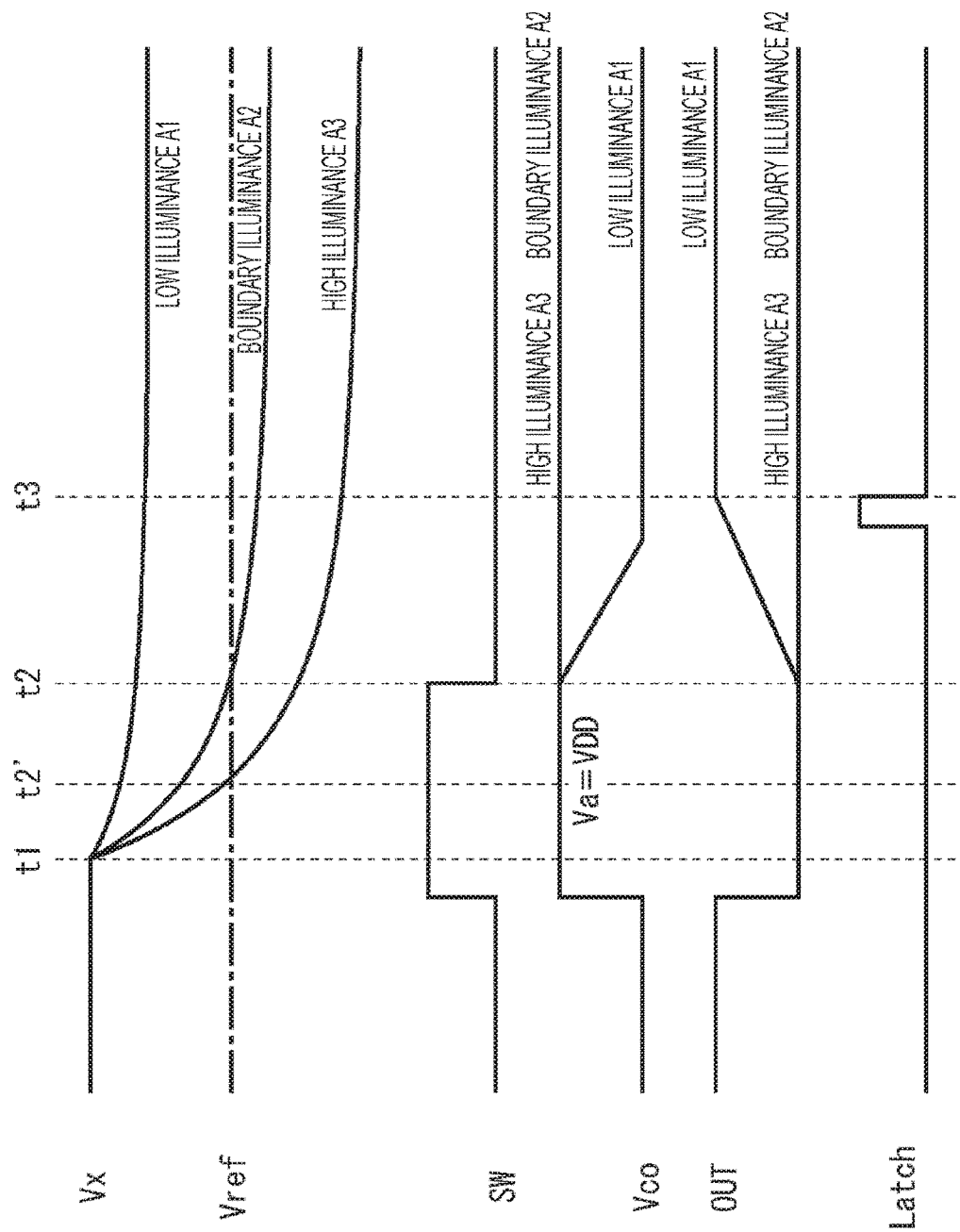
FIG. 9 is a timing chart explaining an operation of the comparator circuit of the present technology.

Next, with reference to the timing chart of FIG. 9, details of a comparison (determination) operation of the reference voltage (the predetermined determination value) with the pixel signal Vx from time T7 to T8 (a determination period) in the timing chart of FIG. 3 when the comparator circuit (the comparing unit 162) of FIGS. 7 and 8 is used are described.

In the timing chart of FIG. 9 similarly to the timing chart of FIG. 5, time t1, time t2, and time t3 indicate the timing to start to read the pixel signal, the timing when the pixel signal Vx of the boundary illuminance A2 intersects the reference voltage Vref, and the timing to stop latching the output OUT as the comparison result respectively.

Furthermore, in the timing chart of FIG. 9 similarly to the timing chart of FIG. 5, the pixel signal Vx in the cases of the low illuminance A1, the boundary illuminance A2, and the high illuminance A3 is illustrated.

In the example of FIG. 9, the switch circuit 213 fixes the input node (Vco) of the amplification stage 212 to the predetermined voltage Va (=VDD) at which the amplification stage 212 operates in the change direction having a higher output change speed based on the threshold voltage of the amplification stage 212 (the MOS transistor M6) in the period necessary for the pixel signal Vx or the reference signal Vref to be stabilized, and operates so as to release the input node (Vco) of the amplification stage 212 from the predetermined voltage Va (=VDD) after the pixel signal Vx or the reference signal Vref is stabilized.

Specifically, first, the control signal SW rises before time t1, and the comparison result Vco is thereby fixed to H (the predetermined voltage Va (=VDD)), and the output OUT is fixed to L.

Next, the control signal SW falls at time t2, and the comparison result Vco and the output OUT are thereby changed according the relation between the pixel signal Vx and the reference voltage Vref at that time.

In other words, when the pixel signal Vx is the boundary illuminance A2 and the high illuminance A3, the comparison result Vco is not changed from H, and the output OUT is not changed from L either.

On the other hand, when the pixel signal Vx is the low illuminance A1, the comparison result Vco starts to fall from H, and following the falling, the output OUT starts to rise from L. In short, the output OUT is changed from L to H.

In the comparator circuit of FIG. 8, the change direction, that is, the change from L to H is a high-speed change direction the speed of which is not controlled by the current flowing to the constant current source of the amplification stage 212. Thus, it is possible to advance the timing to stop latching at time t3 in the timing chart of FIG. 9 and shorten the change delay time of the comparator circuit from time t2 to t3, and the frame rate is improved.

<Another Configuration Example of Comparator Circuit of the Present Technology>

FIG. 10 is a block diagram illustrating another configuration example of the comparator circuit (the comparing unit 162) to which the present technology is applied.

As illustrated in FIG. 10, the comparing unit 162 includes a comparator 221, an amplification stage 222, and a switch circuit 223.

Note that, the comparator 221 and the amplification stage 222 in FIG. 10 are configured similarly to the comparator 211 and the amplification stage 212 in FIG. 7, and the descriptions thereof are omitted.

The switch circuit 223 operates to, for example, the output node (OUT) of the amplification stage 222 to the predetermined voltage Va in a predetermined period before the comparing operation by the comparator 221 so that the amplification stage 222 operates in a change direction having a higher output change speed according to the control signal SW supplied from the control timing generation unit 121.

Figure 11:
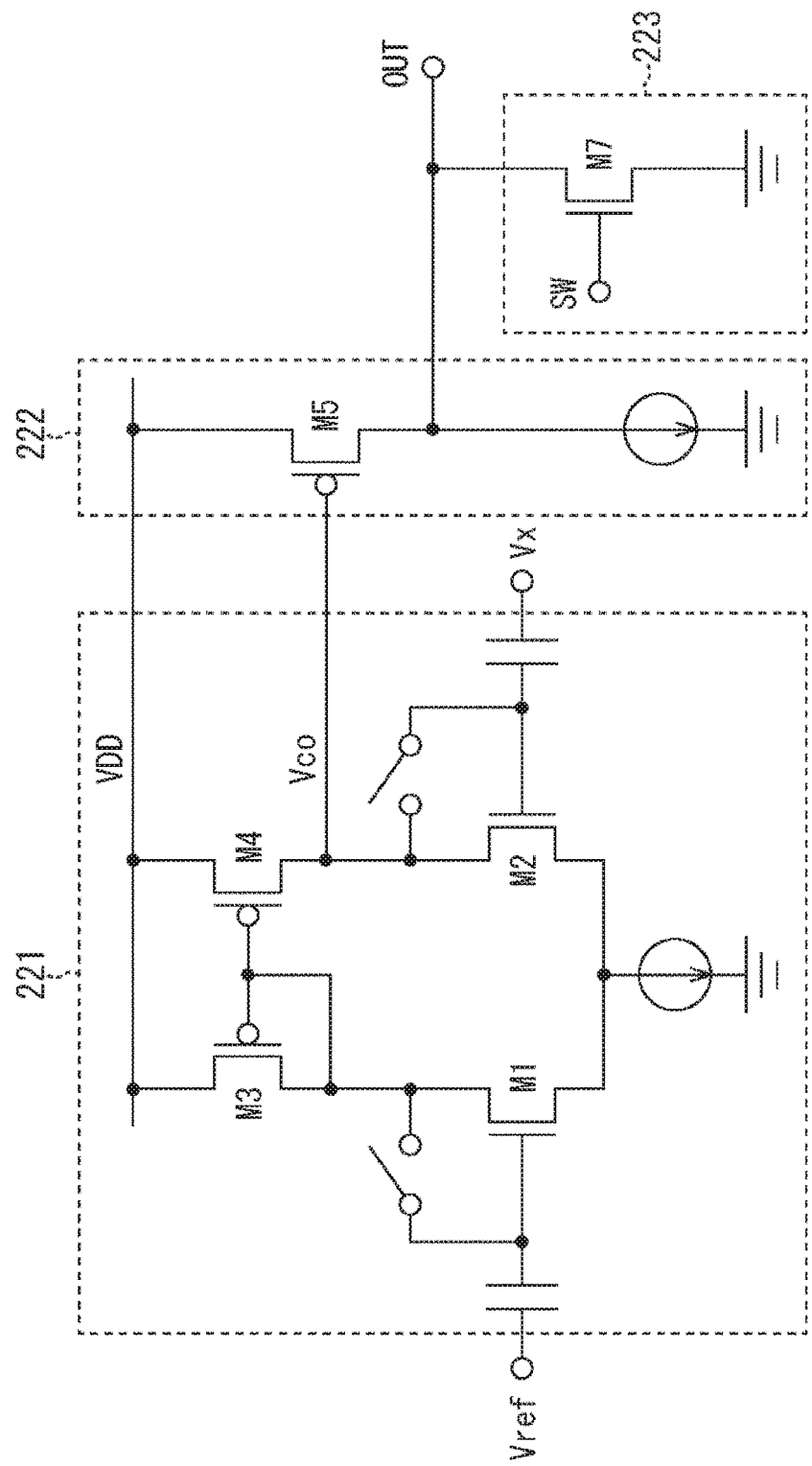
FIG. 11 is a circuit diagram illustrating a configuration example of the comparator circuit of the present technology.

FIG. 11 is a circuit diagram illustrating a configuration example of the comparator circuit 162 of FIG. 10.

Note that, the comparator 221 and the amplification stage 222 in FIG. 11 are also configured similarly to the comparator 211 and the amplification stage 212 in FIG. 8, and the descriptions thereof are omitted.

Furthermore, in the comparator circuit 162, the switch circuit 223 consists of an N-type MOS transistor M7 which short-circuits the input node of the amplification stage 222 to the ground (GND). To the gate of the transistor M7 constituting the switch circuit 223, the control signal SW is input.

<Operation Example of Comparator Circuit>

Figure 12:
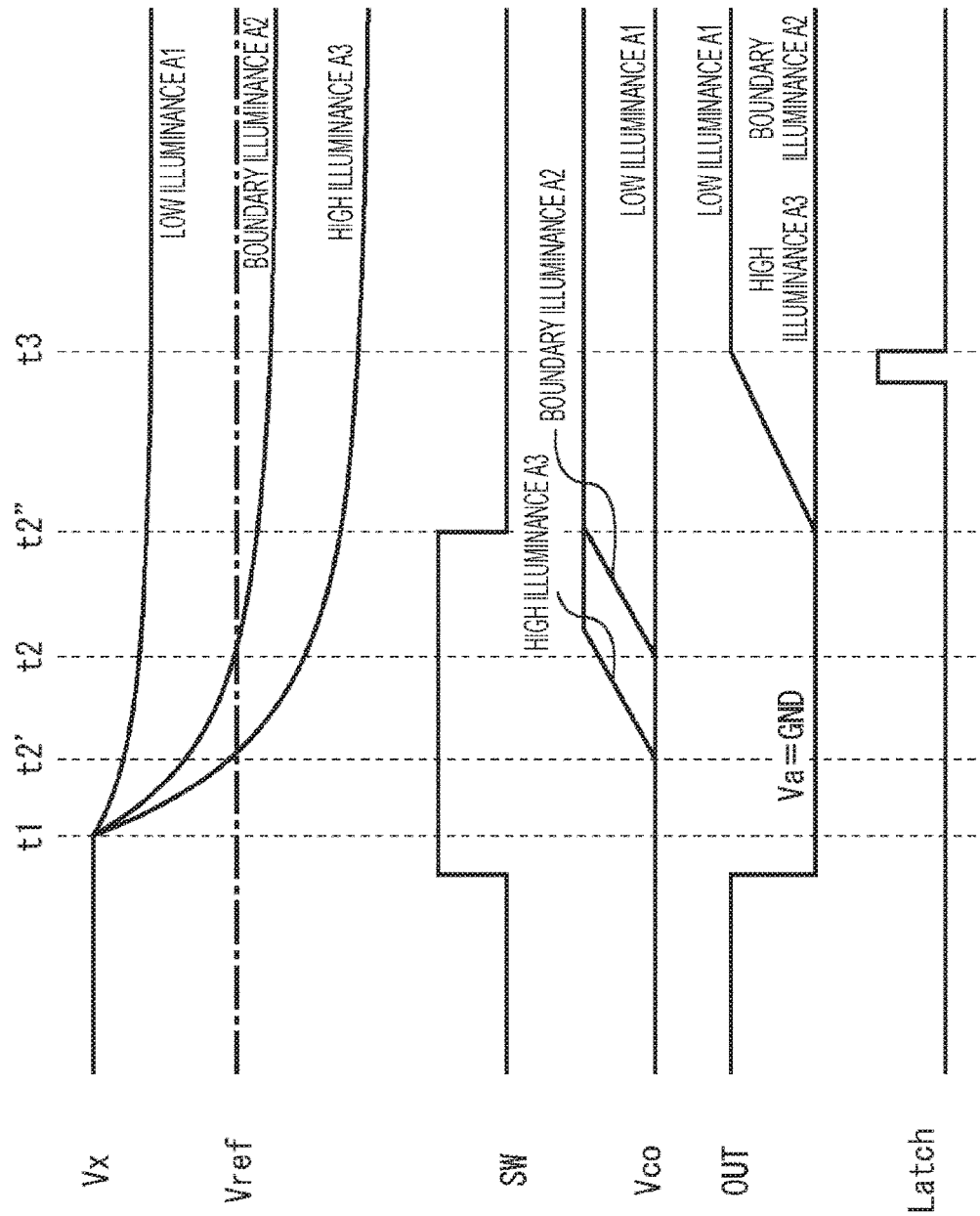
FIG. 12 is a timing chart explaining an operation of the comparator circuit of the present technology.

Next, with reference to the timing chart of FIG. 12, details of a comparison (determination) operation of the reference voltage (the predetermined determination value) with the pixel signal Vx from time T7 to T8 (a determination period) in the timing chart of FIG. 3 when the comparator circuit (the comparing unit 162) of FIGS. 10 and 11 is used are described.

In the timing chart of FIG. 12 similarly to the timing chart of FIG. 5, time t1, time t2, and time t3 indicate the timing to start to read the pixel signal, the timing when the pixel signal Vx of the boundary illuminance A2 intersects the reference voltage Vref, and the timing to stop latching the output OUT as the comparison result respectively.

Furthermore, in the timing chart of FIG. 12 similarly to the timing chart of FIG. 5, the pixel signal Vx in the cases of the low illuminance A1, the boundary illuminance A2, and the high illuminance A3 is illustrated.

In the example of FIG. 12, the switch circuit 223 fixes the output node (OUT) of the amplification stage 222 to the predetermined voltage Va (=GND) at which the amplification stage 222 operates in the change direction having a higher output change speed in the period necessary for the input of the amplification stage (the comparison result Vco) to be stabilized, and operates so as to release the output node (OUT) of the amplification stage 222 from the predetermined voltage Va (=GND) after the input of the amplification stage (the comparison result Vco) is stabilized.

Specifically, first, the control signal SW rises before time t1, and the output OUT is thereby fixed to L (the predetermined voltage Va (=GND)).

When the pixel signal Vx is the high illuminance A3, the comparison result Vco starts to rise from L at time t2', and when the pixel signal Vx is the boundary illuminance A2, the comparison result Vco starts to rise from L at time t2.

When it is assumed that the pixel signal Vx in the case of the boundary illuminance A2, at which the input of the amplification stage 222, that is, the stabilization of the comparison result Vco takes the longest time, completely rises at time t2", the control signal SW falls at time t2", and the output OUT is thereby changed according to the relation between the comparison result Vco and the threshold voltage of the amplification stage 222 (the MOS transistor M7) at that time.

In short, when the pixel signal Vx is the boundary illuminance A2 and the high illuminance A3, the output OUT is not changed from L.

On the other hand, when the pixel signal Vx is the low illuminance A1, the output OUT starts to rise from L. In short, the output OUT is changed from L to H.

In the comparator circuit of FIG. 11, the change direction, that is, the change from L to H is a high-speed change direction the speed of which is not controlled by the current flowing to the constant current source of the amplification stage 222. Thus, it is possible to advance the timing to stop latching at time t3 in the timing chart of FIG. 12 and shorten the change delay time of the comparator circuit from time t2 to t3, and the frame rate is improved.

As described above, although the comparator circuit which is optimized in the change direction at the time of the A/D conversion and uses the amplification stage in the other direction having the slower change speed, it is possible to perform the operation of level determination which is different from the A/D conversion in the optimized change direction.

<Configuration Example of Electronic Device>

Figure 13:
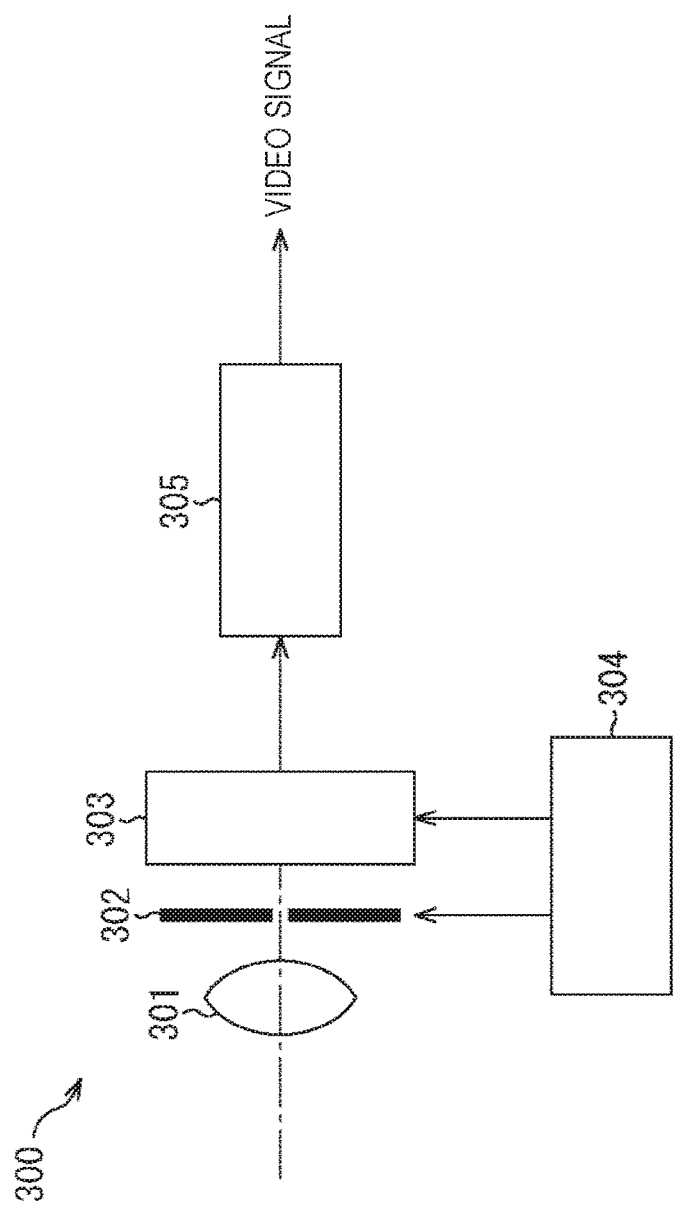
FIG. 13 is a block diagram illustrating a configuration example of an electronic device.

Next, with reference to FIG. 13, a configuration example of an electronic device to which the present technology is applied is described.

An electronic device 300 illustrated in FIG. 13 includes an optical lens 301, a shutter device 302, a solid-state imaging apparatus 303, a drive circuit 304, and a signal processing circuit 305. FIG. 13 illustrates a configuration when the CMOS image sensor 100 of the above described embodiment is provided as the solid-state imaging apparatus 303 to an electronic device (for example, a digital still camera).

The optical lens 301 forms image light (incident light) from a subject on an imaging face of the solid-state imaging apparatus 303. In the solid-state imaging apparatus 303, signal charge is thereby stored for a certain period of time. The shutter device 302 controls a light radiating period and a light shielding period with respect to the solid-state imaging apparatus 303.

The drive circuit 304 supplies a drive signal for controlling a signal transferring operation of the solid-state imaging apparatus 303 and a shutter operation of the shutter device 302. By the drive signal (timing signal) supplied from the drive circuit 304, the solid-state imaging apparatus 303 performs signal transfer. The signal processing circuit 305 performs various types of signal processing to the signal output from the solid-state imaging apparatus 303. The video signal subjected to the signal processing is stored in a storage medium such as a memory, or output to a monitor.

Furthermore, the electronic device 300 includes a lens driving unit (not illustrated) which drives the optical lens 301 in the optical axis direction. The lens driving unit and the optical lens 301 constitute a focusing mechanism which adjusts the focus. Then, in the electronic device 300, a system controller, which is not illustrated, variously controls the focusing mechanism, the above described constituent elements, and the like.

In the electronic device 300 of an embodiment of the present technology, since the solid-state imaging apparatus 303 enables to improve a frame rate, it is possible to enhance image quality as a result.

Note that, the embodiment of the present technology is not limited to the above described embodiment, and can be variously modified without departing from the scope of the present technology.

Furthermore, the present technology may have the following configurations:

(1)

A comparator circuit including:

a comparator configured to compare an analog signal with a reference signal;

an amplification stage configured to amplify output of the comparing unit and have different output change speeds in normal rotation and in reverse rotation; and a switch circuit configured to fix an input node or an output node of the amplification stage to a predetermined voltage in a predetermined period before a comparing operation by the comparator such that the amplification stage operates in a change direction having a higher output change speed.

(2)

The comparator circuit described in (1), in which the switch circuit fixes, in the predetermined period necessary for the analog signal or the reference signal to be stabilized, the input node of the amplification stage to the predetermined voltage at which the amplification stage operates in the change direction having the higher output change speed based on a threshold voltage of the amplification stage.

(3)

The comparator circuit described in (2), in which the switch circuit releases the input node of the amplification stage from the predetermined voltage after the analog signal or the reference signal is stabilized.

(4)

The comparator circuit described in (1), in which the switch circuit fixes, in the predetermined period necessary for input of the amplification stage to be stabilized, the output node of the amplification stage to the predetermined voltage at which the amplification stage operates in the change direction having the higher output change speed.

(5)

The comparator circuit described in (4), in which the switch circuit releases the output node of the amplification stage from the predetermined. voltage after the input of the amplification stage is stabilized.

(6)

The comparator circuit described in any one of (1) to (5), in which the analog signal is a pixel signal output from a unit pixel.

(7)

A solid-state imaging apparatus including:

a pixel array unit having a plurality of pixels;

a comparator circuit including a comparator configured to compare an analog signal output from the pixel with a reference signal, an amplification stage configured to amplify output of the comparing unit and have different output change speeds in normal rotation and in reverse rotation, and a switch circuit configured to fix an input node or an output node of the amplification stage to a predetermined voltage in a predetermined period before a comparing operation by the comparator such that the amplification stage operates in a change direction having a higher output change speed;

a selecting unit configured to select, according to a comparison result of the analog signal with one or more of the reference signals by the comparator circuit, any one of the one or more of the reference signals having gradation accuracy different from each other;

a switching unit configured to switch, according to a selection result by the selecting unit, the reference signal to be supplied to the comparator circuit; and a measuring unit configured to measure change timing of the comparison result, by the comparator circuit, of the analog signal with the reference signal supplied to the comparator circuit by switching control of the switching unit.

(8)

An electronic device including:

a solid-state imaging apparatus including:

a pixel array unit having a plurality of pixels;

a comparator circuit including a comparator configured to compare an analog signal output from the pixel with a reference signal, an amplification stage configured to amplify output of the comparing unit and have different output change speeds in normal rotation and in reverse rotation, and a switch circuit configured to fix an input node or an output node of the amplification stage to a predetermined voltage in a predetermined period before a comparing operation by the comparator such that the amplification stage operates in a change direction having a higher output change speed;

a selecting unit configured to select, according to a comparison result of the analog signal with one or more of the reference signals by the comparator circuit, any one of the one or more of the reference signals having gradation accuracy different from each other;

a switching unit configured to switch, according to a selection result by the selecting unit, the reference signal to be supplied to the comparator circuit; and a measuring unit configured to measure change timing of the comparison result, by the comparator circuit, of the analog signal with the reference signal supplied to the comparator circuit by switching control of the switching unit.

REFERENCE SIGNS LIST

100 CMOS image sensor
112 A/C converter
151 Column A/D converter
162 Comparing unit
211 Comparator
212 Amplification stage
213 Switch circuit
221 Comparator
222 Amplification stage
223 Switch circuit
300 Electronic device
303 Solid-state imaging apparatus

The invention claimed is:

1. An imaging device comprising:

a pixel that outputs a pixel signal;

a signal line coupled to the pixel;

first reference signal generation circuitry;

second reference signal generation circuitry;

first switch circuitry; and a comparator coupled to the signal line, the comparator including:

first circuitry including:

a first differential transistor coupled to the signal line;

a second differential transistor coupled to the first and the second reference signal generation circuitry through the first switch circuitry; and a first output node coupled to at least one of the first or the second differential transistors; and second circuitry including:

a first transistor, a gate of the first transistor coupled to the first output node, and a source or a drain of the first transistor supplied with a first potential; and a second output node coupled to the first transistor; and a second switch circuitry coupled to the second output node, wherein the second switch circuitry is configured to selectively supply a second potential to the second output node.

2. The imaging device of claim 1, wherein the first switch circuitry comprises a first switch between the first reference signal generation circuitry and the comparator and a second switch between the second reference signal generation circuitry and the comparator.

3. The imaging device of claim 2, wherein the first circuitry is configured to compare a first reference signal from the first reference signal generation circuitry to the pixel signal from the signal line, and compare a second reference signal from the second reference signal generation circuitry to the pixel signal from the signal line.

4. The imaging device of claim 3, wherein when the first switch couples the first reference signal generation circuitry to the first circuitry, the first circuitry compares the first reference signal to the pixel signal, and when the second switch couples the second reference signal generation circuitry to the first circuitry, the first circuitry compares the second reference signal to the pixel signal.

5. The imaging device of claim 3, wherein the first reference signal is different from the second reference signal.

6. The imaging device of claim 1, wherein the second switch circuitry includes a second transistor, one of a source or a drain of the second transistor is coupled to the second output node, and the other of the source or the drain of the second transistor is supplied with the second potential.

7. The imaging device of claim 6, wherein the first potential is a power source potential.

8. The imaging device of claim 7,
wherein the second potential is a ground potential.
9. The imaging device of claim 1,
wherein the first differential transistor is configured to receive the pixel signal from the signal line, and the second differential transistor is configured to receive a first reference signal from the first reference signal generation circuitry or a second reference signal from the second reference signal generation circuitry selectively.
10. The imaging device of claim 9,
wherein the first circuitry is configured to output a differential signal to the second circuitry.
11. The imaging device of claim 1,
wherein a first polarity type of the first differential transistor and the second differential transistor is different than a second polarity type of the first transistor.
12. The imaging device of claim 6,
wherein a polarity type of the second transistor is different than a second polarity type of the first transistor.
13. The imaging device of claim 1,
further comprising third switch circuitry coupled to the first output node and the gate of the first transistor, and
wherein the third switch circuitry is configured to selectively supply the first potential to the first output node.
14. The imaging device of claim 13,
wherein the third switch circuitry includes a third transistor, and
wherein one of a source or a drain of the third transistor is coupled to the first output node, and the other of the source or the drain of the third transistor is supplied with the first potential.
15. The imaging device of claim 14,
wherein the first potential is a power source potential.
16. The imaging device of claim 15,
wherein the second potential is a ground potential.
17. The imaging device of claim 14,
wherein a first polarity type of the first differential transistor and the second differential transistor is different than a second polarity type of the first transistor and the third transistor.
18. A light detecting device comprising:
a pixel that outputs a pixel signal;
a signal line coupled to the pixel;
first reference signal generation circuitry;
second reference signal generation circuitry;
first switch circuitry; and
a comparator coupled to the signal line, the comparator including;
  first circuitry including:
    a first differential transistor coupled to the signal line;
    a second differential transistor coupled to the first and the second reference signal generation circuitry through the first switch circuitry; and
    a first output node coupled to at least one of the first or the second differential transistors; and
  second circuitry including:
    a first transistor, a gate of the first transistor coupled to the first output node, and a source or a drain of the first transistor supplied with a first potential; and
    a second output node coupled to the first transistor; and
a second switch circuitry coupled to the second output node,
wherein the second switch circuitry is configured to selectively supply a second potential to the second output node.
19. The light detecting device of claim 18,
wherein the first switch circuitry comprises a first switch between the first reference signal generation circuitry and the comparator and a second switch between the second reference signal generation circuitry and the comparator.
20. The light detecting device of claim 19,
wherein the first circuitry is configured to compare a first reference signal from the first reference signal generation circuitry to the pixel signal from the signal line, and compare a second reference signal from the second reference signal generation circuitry to the pixel signal from the signal line.
21. The light detecting device of claim 20,
wherein when the first switch couples the first reference signal generation circuitry to the first circuitry, the first circuitry compares the first reference signal to the pixel signal, and when the second switch couples the second reference signal generation circuitry to the first circuitry, the first circuitry compares the second reference signal to the pixel signal.
22. The light detecting device of claim 20,
wherein the first reference signal is different from the second reference signal.
23. The light detecting device of claim 18,
wherein the second switch circuitry includes a second transistor, one of a source or a drain of the second transistor is coupled to the second output node, and the other of the source or the drain of the second transistor is supplied with the second potential.
24. The light detecting device of claim 23,
wherein the first potential is a power source potential.
25. The light detecting device of claim 24,
wherein the second potential is a ground potential.
26. The light detecting device of claim 18,
wherein the first differential transistor is configured to receive the pixel signal from the signal line, and the second differential transistor is configured to receive a first reference signal from the first reference signal generation circuitry or a second reference signal from the second reference signal generation circuitry selectively.
27. The imaging device of claim 26,
wherein the first circuitry is configured to output a differential signal to the second circuitry.
28. The light detecting device of claim 18,
wherein a first polarity type of the first differential transistor and the second differential transistor is different than a second polarity type of the first transistor.
29. The light detecting device of claim 23,
wherein a polarity type of the second transistor is different than a second polarity type of the first transistor.
30. The light detecting device of claim 18,
further comprising third switch circuitry coupled to the first output node and the gate of the first transistor, and
wherein the third switch circuitry is configured to selectively supply the first potential to the first output node.
31. The light detecting device of claim 30,
wherein the third switch circuitry includes a third transistor, and
wherein one of a source or a drain of the third transistor is coupled to the first output node, and the other of the source or the drain of the third transistor is supplied with the first potential.

32. The light detecting device of claim 31,
wherein the first potential is a power source potential.
33. The light detecting device of claim 32,
wherein the second potential is a ground potential.
34. The light detecting device of claim 31,
wherein a first polarity type of the first differential transistor and the second differential transistor is different than a second polarity type of the first transistor and the third transistor.

* * * * *